United States Patent
Tsai et al.

(10) Patent No.: US 9,286,979 B2
(45) Date of Patent: *Mar. 15, 2016

(54) METHOD AND STRUCTURE FOR RESISTIVE SWITCHING RANDOM ACCESS MEMORY WITH HIGH RELIABLE AND HIGH DENSITY

(71) Applicant: TAIWAN SEMICONDUCTOR MANUFACTURING COMPANY, LTD., Hsin-Chu (TW)

(72) Inventors: Chun-Yang Tsai, Hsinchu (TW); Yu-Wei Ting, Taipei (TW); Kuo-Ching Huang, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/697,849

(22) Filed: Apr. 28, 2015

(65) Prior Publication Data

US 2015/0235698 A1     Aug. 20, 2015

Related U.S. Application Data

(63) Continuation of application No. 13/688,968, filed on Nov. 29, 2012, now Pat. No. 9,019,743.

(51) Int. Cl.
| | | |
|---|---|---|
| *G11C 11/00* | (2006.01) | |
| *G11C 13/00* | (2006.01) | |
| *H01L 45/00* | (2006.01) | |
| *H01L 27/24* | (2006.01) | |

(52) U.S. Cl.
CPC ........ *G11C 13/0069* (2013.01); *G11C 13/0097* (2013.01); *H01L 27/2436* (2013.01); *H01L 27/2463* (2013.01); *H01L 45/08* (2013.01); *H01L 45/1233* (2013.01); *H01L 45/1253* (2013.01); *H01L 45/145* (2013.01); *H01L 45/146* (2013.01); *G11C 2013/0083* (2013.01)

(58) Field of Classification Search
USPC .......................................... 364/148; 365/148
See application file for complete search history.

(56) References Cited

U.S. PATENT DOCUMENTS

| | | |
|---|---|---|
| 7,778,063 B2 | 8/2010 | Brubaker et al. |
| 7,835,172 B2 | 11/2010 | Shinozaki |
| 8,009,454 B2 | 8/2011 | Lee et al. |

(Continued)

FOREIGN PATENT DOCUMENTS

| | | |
|---|---|---|
| CN | 1672214 (A) | 9/2005 |
| TW | 201110439 (A) | 3/2011 |
| WO | WO 2011008195 A2 | 1/2011 |

OTHER PUBLICATIONS

Wong, H.-S. Philip. et al., "Metal-Oxide RRAM," 0018-9219/531.00 © 2012 IEEE, 20 pages (Continued)

*Primary Examiner* — Hoai V Ho
*Assistant Examiner* — Pablo Huerta
(74) *Attorney, Agent, or Firm* — Haynes and Boone, LLP

(57) ABSTRACT

The present disclosure provides a resistive random access memory (RRAM) structure. The RRAM structure includes a bottom electrode on a substrate; a resistive material layer on the bottom electrode, the resistive material layer having filament features with a filament ratio greater than about 0.5; and a top electrode on the resistive material layer.

20 Claims, 10 Drawing Sheets

(56) References Cited

U.S. PATENT DOCUMENTS

| | | |
|---|---|---|
| 8,289,752 B2 | 10/2012 | Lu et al. |
| 8,575,585 B2 | 11/2013 | Yang et al. |
| 9,019,743 B2* | 4/2015 | Tsai .................. G11C 11/21 |
| | | 365/148 |
| 2009/0039332 A1* | 2/2009 | Lee ..................... H01L 45/04 |
| | | 257/4 |
| 2010/0034010 A1 | 2/2010 | Xi et al. |
| 2010/0110758 A1 | 5/2010 | Li et al. |
| 2010/0123117 A1* | 5/2010 | Sun .................. H01L 45/085 |
| | | 257/5 |
| 2010/0285633 A1* | 11/2010 | Sun .................. H01L 45/085 |
| | | 438/104 |
| 2010/0327248 A1* | 12/2010 | Khoueir .............. H01L 43/12 |
| | | 257/2 |
| 2011/0095259 A1 | 4/2011 | Lee |
| 2011/0220862 A1 | 9/2011 | Arita et al. |
| 2011/0291064 A1 | 12/2011 | Marsh et al. |
| 2011/0317470 A1* | 12/2011 | Lu .................. G11C 13/0007 |
| | | 365/148 |
| 2012/0040528 A1* | 2/2012 | Kim ............... H01L 21/76816 |
| | | 438/675 |
| 2012/0074374 A1* | 3/2012 | Jo .................... H01L 45/085 |
| | | 257/4 |
| 2012/0153249 A1* | 6/2012 | Zhang ................ H01L 45/08 |
| | | 257/4 |
| 2012/0176831 A1* | 7/2012 | Xiao ............... G11C 13/0007 |
| | | 365/148 |
| 2012/0178210 A1* | 7/2012 | Lee .................... H01L 45/04 |
| | | 438/104 |
| 2013/0001494 A1* | 1/2013 | Chen ................ G11C 13/003 |
| | | 257/1 |
| 2013/0028003 A1 | 1/2013 | Wang et al. |
| 2013/0187117 A1 | 7/2013 | Sandhu et al. |
| 2013/0207065 A1 | 8/2013 | Chiang |
| 2013/0215669 A1 | 8/2013 | Haukness |
| 2013/0234099 A1* | 9/2013 | Sekar ............... G11C 13/0007 |
| | | 257/4 |
| 2013/0334486 A1 | 12/2013 | Tsai et al. |
| 2013/0336041 A1 | 12/2013 | Tsai et al. |
| 2014/0146593 A1 | 5/2014 | Tsai et al. |

OTHER PUBLICATIONS

Wei, Z., et al., "Demonstration of High-density ReRAM Ensuring 10-year Retention at 85oC Based on a Newly Developed Reliability Model," Advanced Devices Development Center, Panasonic Co., 978-1-4577-0505-2/11/S26.00 © 2011 IEEE, 4 pages.

* cited by examiner

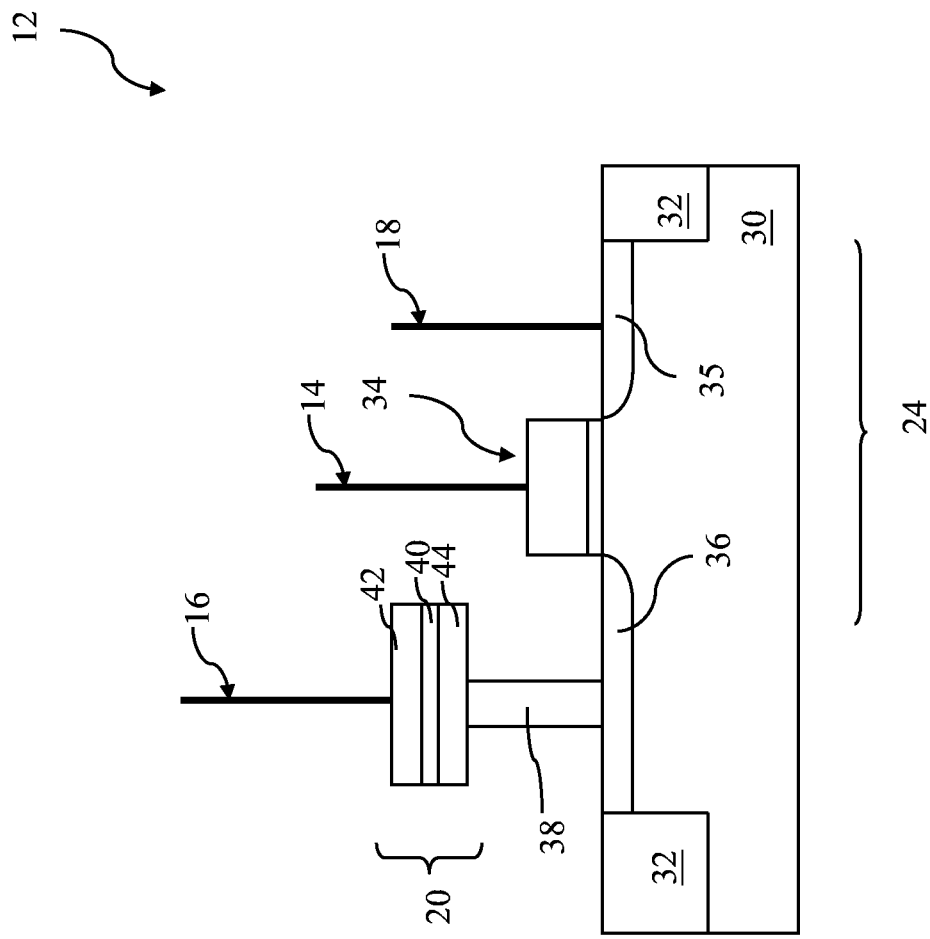

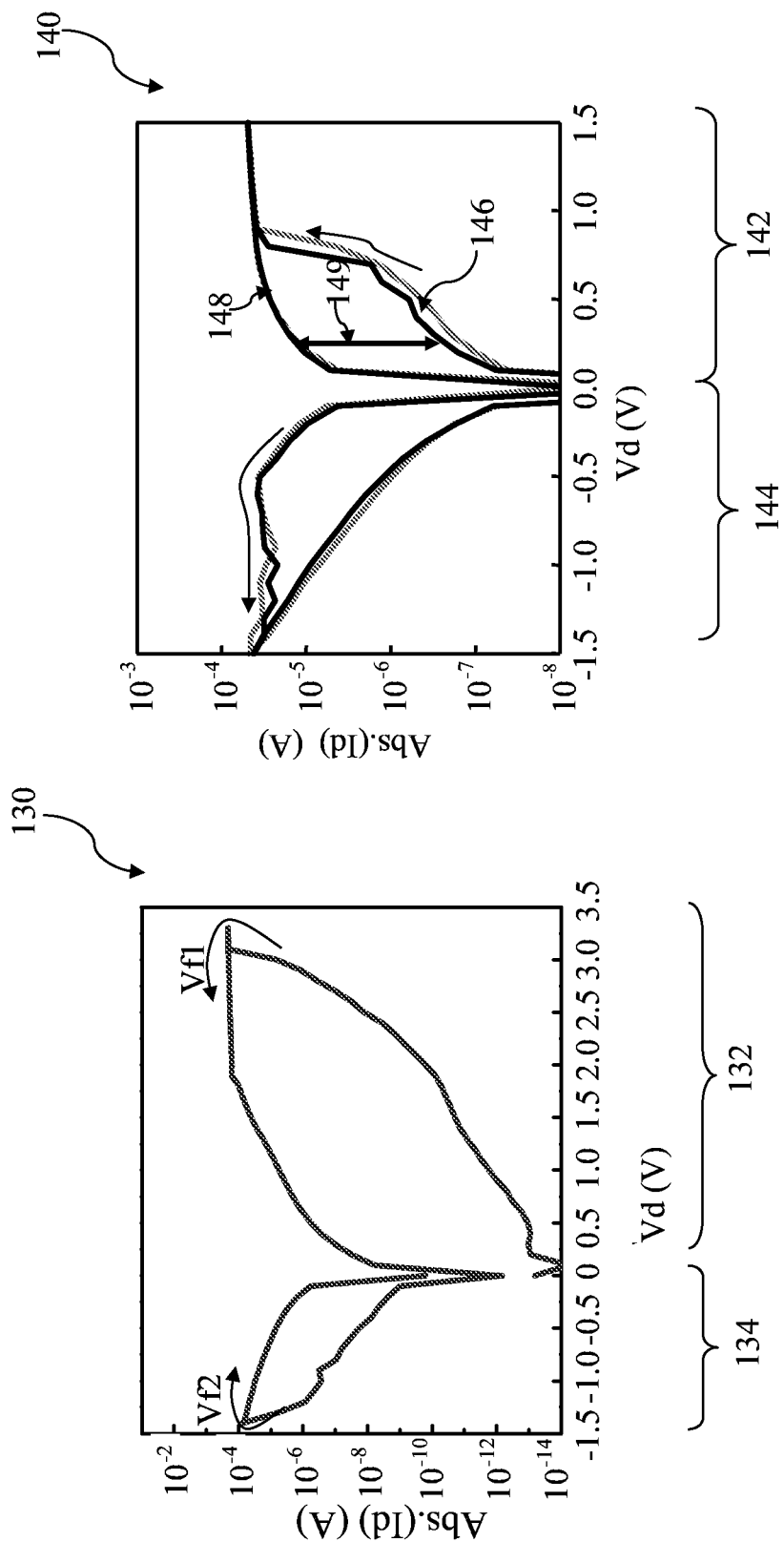

METHOD AND STRUCTURE FOR RESISTIVE SWITCHING RANDOM ACCESS MEMORY WITH HIGH RELIABLE AND HIGH DENSITY

PRIORITY DATA

The present application is a continuation application of U.S. patent application Ser. No. 13/688,968, filed Nov. 29, 2012, which is incorporated herein by reference in its entirety.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1."

In advanced technology nodes, the feature size scales down and the size of memory devices is reduced accordingly. However, the reduction of the RRAM devices is limited due to the "forming" operation. In the "forming" process, a high voltage is applied to the RRAM device to generate a conductive path in the resistive material layer of the DRRAM device. The high "forming" voltage introduces reliability concern. Furthermore, the high current during the operations of the RRAM device leads to concerns of the high power consumption and reliability since high current means high current density. To reduce the current density, the size of the RRAM device needs to be big enough in the cost of the circuit packing density.

There are various architectures to configure an array of RRAM cells. For example, across-point architecture includes only a RRAM in each cell configured between crossed a word line and a bit line. The cross-point architecture has a high packing density but has a sneak path issue, which causes a fault read during operation. In other architectures of a RRAM array, such as 1T1R that includes one transistor and one RRAM device, the operation voltage could be very high, causing the damage to the transistor.

Accordingly, it would be desirable to provide an improved RRAM structure and a method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 5 is a sectional view of a memory cell of FIG. 4 having a RRAM device and a FET constructed according to aspects of the present disclosure in one embodiment.

FIG. 10 is a diagram illustrating a current vs. voltage behavior of the RRAM device of FIG. 4 during a forming process in one embodiment.

FIG. 11 is a diagram illustrating a current vs. voltage behavior of the RRAM device of FIG. 4 during set and reset operations in one embodiment.

DETAILED DESCRIPTION

Figure 1:
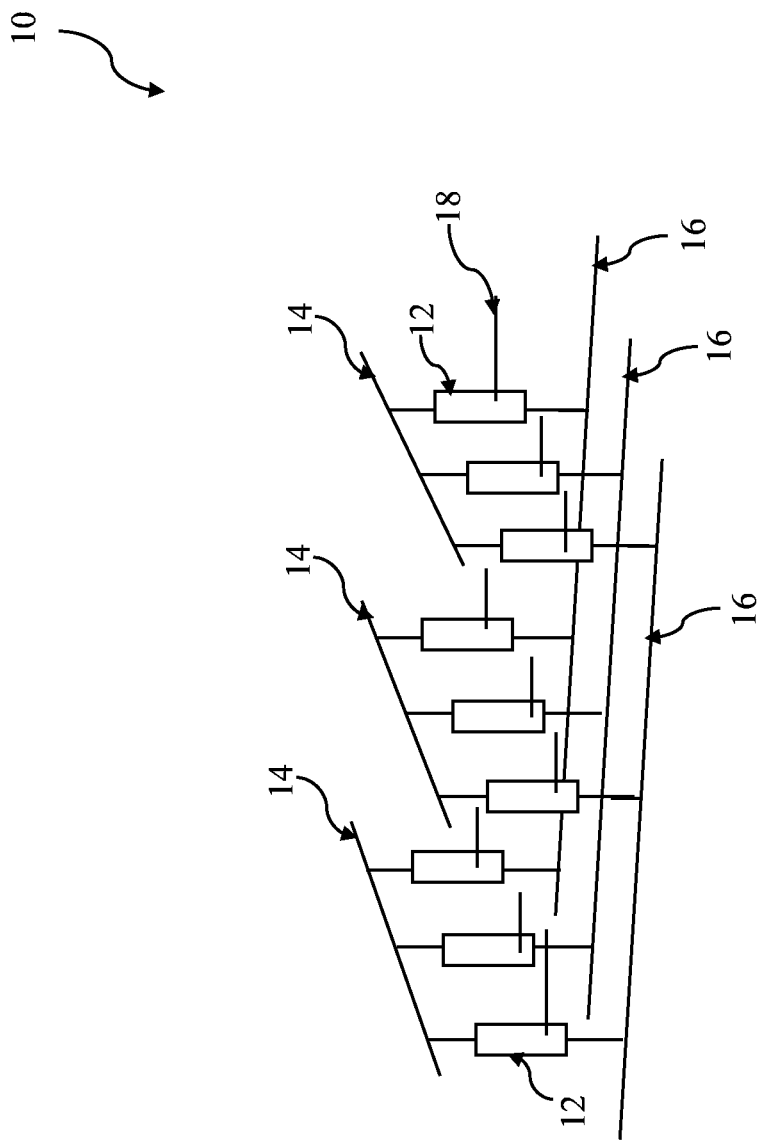
FIG. 1 is a memory structure having a plurality of memory cells constructed according to aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a schematic view of a memory structure 10 having a plurality of memory cells 12 constructed according to aspects of the present disclosure in one embodiment. The memory cells are configured in an array coupled with a plurality of word lines 14 and a plurality of bit lines 16. In one embodiment, the word lines 14 and the bit lines 16 are cross configured. Furthermore, each of the memory cells 12 is operable to achieve multiple resistance levels and accordingly multiple bit storage. In the present embodiment, source lines 18 are configured to connect to the memory cells, respectively. The source lines 18 may be configured such that one source line couples to one memory cell, or alternatively one source line couples a subset of the memory cells in the memory structure 10. The memory cell 12, the method making the same and the method operating the same are collectively described below with reference to FIGS. 1 through 17.

Figure 2:
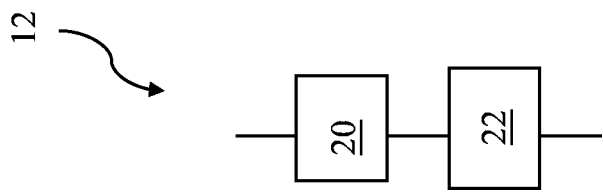
FIG. 2 is a schematic view of a memory cell of FIG. 1 having a resistive random access memory (RRAM) device and a current-controlling device constructed according to aspects of the present disclosure in various embodiments.

FIG. 2 is a schematic view of the memory cell 12 constructed according to one embodiment. Referring to FIG. 2, the memory cell 12 includes one resistive random access memory (RRAM) device 20 and a current-controlling device 22 connected together. The RRAM device 20 includes a resistive material layer (or a dielectric material layer) interposed between two electrodes. Furthermore, the resistive material layer of the RRAM device 20 includes filament features having a filament ratio greater than about 0.5. The filament features of the RRAM device 20 with the filament ratio greater than about 0.5 are formed by a bidirectional forming process. The filament ratio and the forming process are further described later. In one embodiment, the resistive material layer includes a defect engineering film formed by a technique including a defect engineering treatment (DET) process. In another embodiment, the resistance of the RRAM device 20 is operable to be adjusted into multiple levels that represent different logic states, respectively. In yet another embodiment, the RRAM device 20 further includes a capping layer disposed between the dielectric layer and one of the electrodes.

Figure 3:
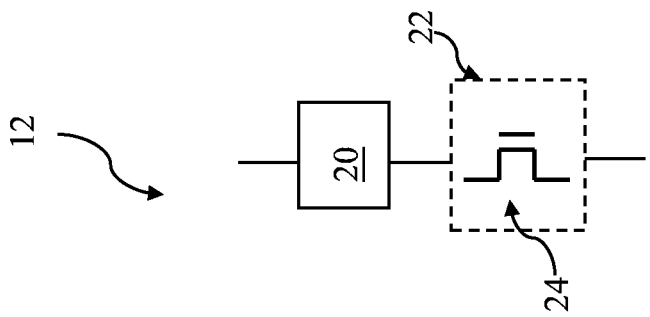

The current-controlling device 22 in the memory cell 12 is a device that is operable to control the current flow through the RRAM device 20 during the operations. In the present embodiment, the current-controlling device 22 is a transistor 24, such as a field effect transistor (FET), as illustrated in FIG. 3 in a schematic view. For example, the transistor 24 is a metal-oxide-semiconductor (MOS) FET. In a particular example, the one electrode of the RRAM device is connected to the drain of the transistor 24. The gate of the FET 24 is connected to the word line and the other electrode of the RRAM device 20 is connected to the bit line.

Figure 4:
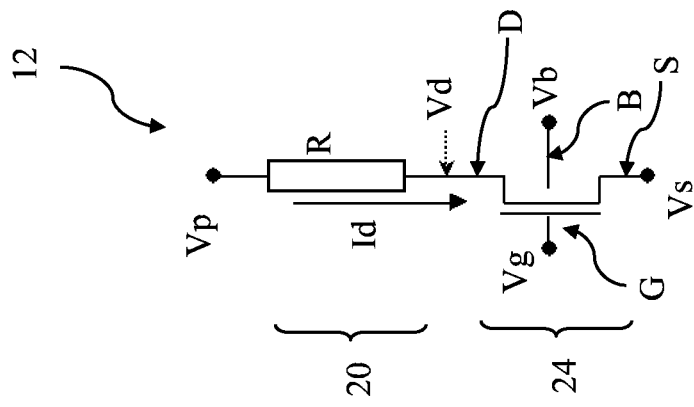
FIGS. 3 and 4 are schematic views of a memory cell of FIG. 1 having a RRAM device and a field-effect transistor (FET) constructed according to aspects of the present disclosure in various embodiments.

FIG. 4 is a schematic view of the memory cell 12 constructed according to aspects of the present disclosure in another embodiment. The memory cell 12 includes a RRAM device 20 and a FET 24 electrically connected. Particularly, one electrode of the RRAM device 20, such as bottom electrode, is connected to the drain of the transistor 24. The gate of the transistor 24 is connected to the word line. Another electrode of the RRAM device 20, such as top electrode, is connected to the bit line. The gate, source, drain and body of the transistor 24 are labeled as G, S, D and B, respectively. The corresponding voltages of the gate, source, drain and substrate during the operations are labeled as Vg, Vs, Vd and Vb, respectively. Furthermore, during the operation, the current through the RRAM device 20 is labeled as Id and the voltage applied to one electrode of the RRAM device 20 from the bit line is labeled as Vp.

In one embodiment, the memory cell 12 is a two terminal device with the gate of the transistor 24 as a first terminal and one electrode of the RRAM device 20 as a second terminal. The first terminal is controlled by a first voltage applied to the gate from the word line and the second terminal is controlled by a second voltage applied to the one electrode of the RRAM device from the bit line. In one example, the source is grounded, and the substrate (or the body of the transistor 24) is grounded or floating.

In another embodiment, the memory cell 12 is a three terminal device, wherein the three terminals of the memory cell 12 includes the gate of the transistor 24 as a first terminal, the electrode of the RRAM device 20 (the electrode that is not directly connected with the drain of the transistor) as a second terminal and the source of the transistor 24 as a third terminal. Particularly, during the operations of the memory cell 12, the first terminal (gate) is controlled by a first voltage from the word line, the second terminal is controlled by a second voltage from the bit line, and the third terminal is controlled by a third voltage from a source line. In one example, the source is grounded. In an alternative example, the second terminal is grounded. The substrate (or the body) of the transistor 24 may be grounded or floating.

FIG. 5 illustrates a sectional view of the memory cell 12 that includes the FET 24 and the RRAM device 20 formed on a substrate 30 and coupled together. In one example, the substrate 30 is a semiconductor substrate, such as a silicon substrate or alternatively other suitable semiconductor substrate. Various isolation features 32, such as shallow trench isolation (STI) features are formed on the substrate 30 and define various active regions. The FET 24 includes a gate 34 disposed on the substrate 30. The gate includes a gate dielectric layer and a gate electrode disposed on the gate dielectric layer. In various examples, the gate dielectric layer includes a high k dielectric material and the gate electrode includes metal. The FET 24 further includes a source 35 and a drain 36 formed in the substrate 30. The gate 34 is horizontally interposed between the source 35 and the drain 36.

The RRAM 20 includes a resistive material layer 40 interposed between a top electrode 42 and a bottom electrode 44. In one embodiment, the resistive material layer includes a defect engineering film formed by a technique including a DET process. In another embodiment, the resistance of the RRAM device 20 is operable to be adjusted into multiple levels that represent different logic states, respectively. In yet another embodiment, the RRAM device 20 further includes a capping layer disposed between the dielectric layer and one of the electrodes. Furthermore, the resistive material layer of the RRAM device 20 includes filament features having a filament ratio greater than about 0.5. The filament features of the RRAM device 20 with the filament ratio greater than about 0.5 are formed by a bidirectional forming process.

The memory cell 12 also includes various conductive features 38 to provide electrical routing and connection. The RRAM device 20 and the FET 24 are coupled together through one or more conductive features 38. In one embodiment, the drain 35 of the FET 24 is connected to the bottom electrode 44 of the RRAM device 20. The gate 34 of the FET 24 is connected to the word line 14. The top electrode of the RRAM device 20 is connected to the bit line 16. The source 35 of the FET 24 is connected to the source line 18. The conductive features 38 are portions of an interconnect structure formed on the substrate 30.

Figure 6:
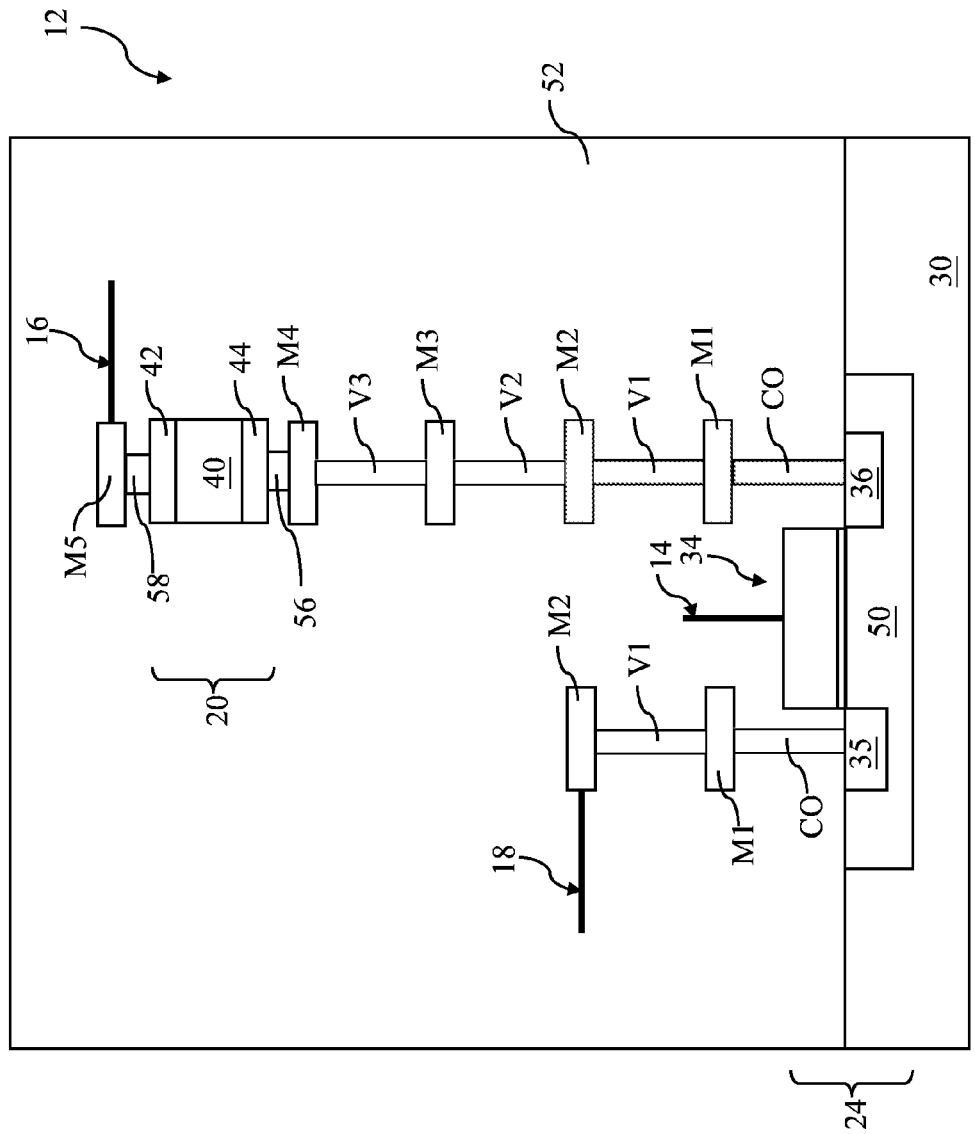
FIG. 6 is a sectional view of a memory cell of FIG. 4 having a RRAM device and a FET constructed according to aspects of the present disclosure in another embodiment.

FIG. 6 is a sectional view of the memory cell 12 constructed according to aspects of the present disclosure in one embodiment. The memory cell 12 includes the FET 24 formed in the substrate 30. Particularly, the FET 24 includes the source 35 and the drain formed in a doped well 50. The doped well is doped with a first type. The source 35 and the drain 36 are doped with a second type opposite to the first type. In the present example, the FET 24 is an n-type FET (nFET). Accordingly, the doped well 50 is p-type well. The source 35 and the drain 36 are n-type. The FET 24 includes the gate 34 formed on the substrate 30. The gate 34 includes a gate dielectric layer and a gate electrode disposed on the gate dielectric layer. The gate 34 is electrically connected to the word line 14 and the source 35 is connected to the source line 18.

The RRAM device 20 is formed in an interconnect structure 52. The interconnect structure 52 includes metal lines distributed in a plurality of metal layers, such as first metal layer (M1), M2 and so on. As an example for illustration, the interconnect structure 52 in FIG. 6 shows 5 metal layers that are respectively labeled as M1, M2, M3, M4 and M5. It is not meant to limit the scope of the disclosure, the interconnect structure 52 may include more or less metal layers. The interconnect structure 52 also includes contact features to provide connection between the substrate 30 and the first metal layer M1. The contact features are labeled as "CO". The interconnect structure 52 also includes via features to provide connection between adjacent metal layers (such as M1 and M2). The via features are labeled as V1, V2, V3 and V4 to represent the via features between M1 & M2, M2 & M3, and M3 & M4, respectively.

The RRAM device 20 is formed in the interconnect structure 52 and is disposed between two metal layers. In the example illustrated in FIG. 6, the RRAM device 20 is disposed between M4 and M5. The RRAM 20 includes the resistive material layer 40 interposed between the top electrode 42 and the bottom electrode 44. The bottom electrode 44 is directly contacted with a bottom via feature 56 and is further coupled to the drain 36 of the FET 24. The top electrode 42 is directly contacted with a top via feature 58 and is further coupled to the bit line 16.

In one embodiment, the resistive material layer 40 includes a defect engineering film formed by a technique including a DET process. In another embodiment, the resistance of the RRAM device 20 can be adjusted to a high resistance state (off state) or a low resistance state (on state). Furthermore, the resistance of the RRAM device 20 is operable to be adjusted into multiple levels that represent different logic states. In yet another embodiment, the RRAM device 20 further includes a capping layer disposed between the dielectric layer and one of the electrodes. Furthermore, the resistive material layer of the RRAM device 20 includes filament features having a filament ratio greater than about 0.5. The filament features of the RRAM device 20 with the filament ratio greater than about 0.5 are formed by a bidirectional forming process.

The RRAM cell 12 may include other features, such as shallow trench isolation (STI) formed in the substrate 30 to provide isolation to various RRAM cells and other devices. In another embodiment, the source line 18 is connected to the source 35 through various conductive features, such as conductive features in CO, M1, V1 and M2 in this example.

Figure 7:
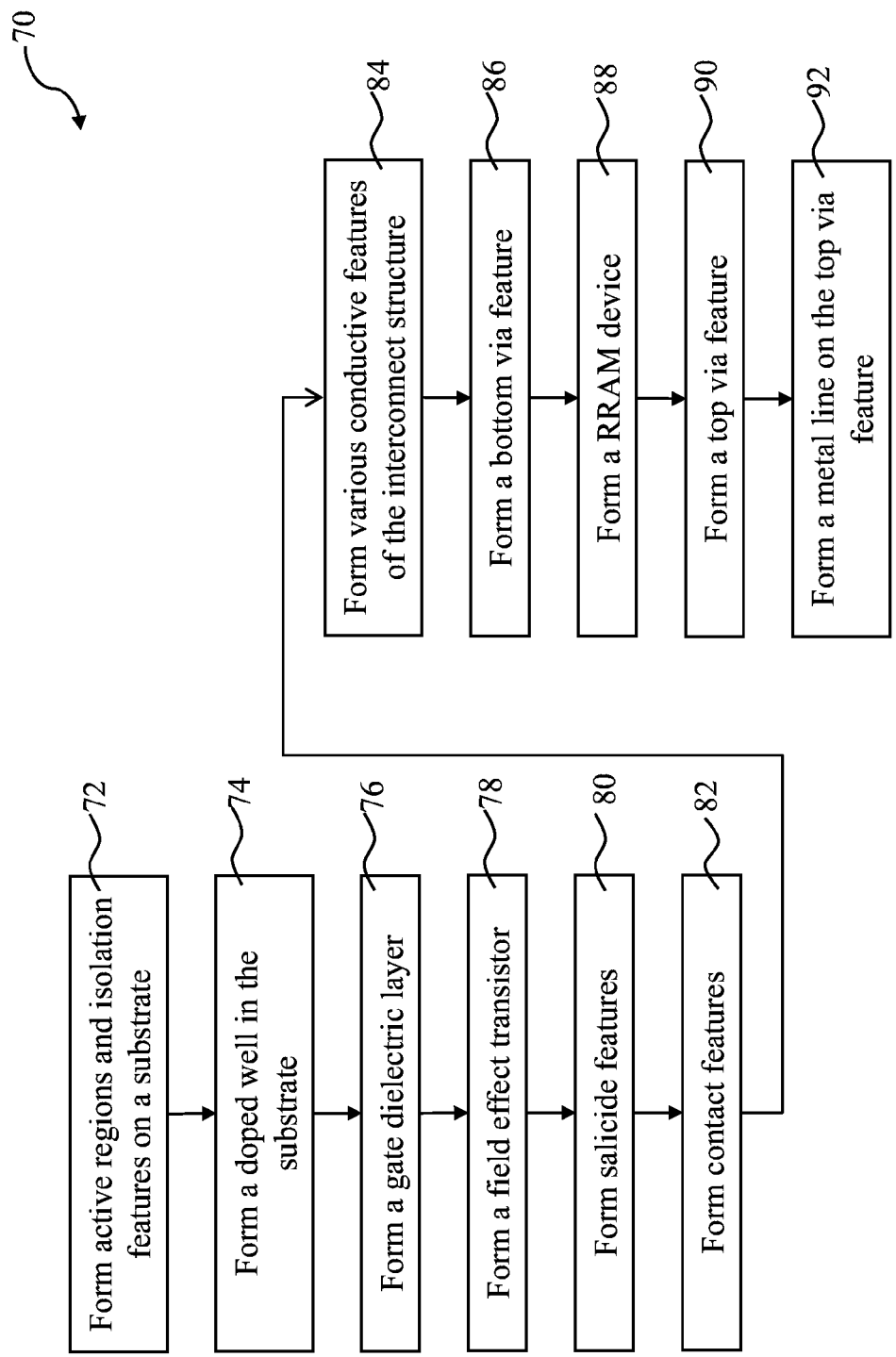
FIG. 7 is a flowchart of a method making of the RRAM cell of FIG. 6 constructed according to aspects of the present disclosure in one or more embodiments.

FIG. 7 is a flowchart of a method 70 making of the RRAM cell 12 constructed according to aspects of the present disclosure in various embodiments. With references to FIGS. 5 through 7 and other figures, the method 50 making the RRAM cell 12 is described according to various embodiments.

The method 70 includes an operation 72 to form isolation features in the substrate 30. In one example, the isolation features include STI features that are formed by a procedure including etching and deposition. In one example to form the STI features, an etching process is applied to form trenches in the substrate. One or more dielectric material is deposited in the trenches. A polishing process, such as chemical mechanical polishing (CMP), is performed to planarize the surface of the substrate. After the formation of the isolation features, the active regions are defined in the substrate 30 for the RRAM cell 12 and other devices to be formed thereon.

The method 70 includes an operation 74 to form the doped well 50 by a suitable technique, such as ion implantation. The method 70 proceeds to form the gate 34. One operation 76 is applied to form gate dielectric, such as silicon oxide, high k dielectric material or combination thereof. In one embodiment, the operation 76 forms a dual gate oxide, such as a first gate oxide of a first thickness for input and output circuit and a second gate oxide of a second thickness for the FET and other field effect transistors. The first thickness is different from the second thickness. For example, the first thickness is greater than the second thickness. The first gate oxide and second gate oxide are formed by a suitable technique (such as thermal oxidation) and procedure. In one example, the first gate oxide and second gate oxide are formed by a procedure including a first thermal oxidation, patterning, and a second thermal oxidation.

The method 70 also includes an operation 78 to form the FET 24. The operation 78 further includes depositing one or more conductive material and patterning the conductive material and the gate oxide to form gate dielectric and gate electrode, respectively. The operation 78 further includes forming source 35 and drain 36 by various ion implantation. In one embodiment, a first ion implantation is applied to the substrate 30 to form light doped drain (LDD) feature; gate spacers are formed on sidewall of the gate 34 by deposition and anisotropic etching; and thereafter a second ion implantation is applied to the substrate to form heavily doped source and drain features that are offset from the LLDD features by the gate spacers. The gate electrode may include doped polycrystalline silicon, metal or metal alloy according to different embodiments.

The method 70 includes an operation 80 to form silicide features on the source 35 and drain 36 for reduced contact resistance. Salicide may be further formed on the gate. In one embodiment, the silicide features are formed by a procedure including metal deposition, annealing and etching.

The method 70 includes an operation 82 to form contact features "CO" by a suitable procedure that includes dielectric deposition, lithography patterning and etching. The method 70 includes an operation 84 to various interconnect features. In the present embodiment, the operation 84 includes forming various conductive features including M1, V1, M2, V2, M3, V3 and M4. In one embodiment, each metal layer, including metal lines and the via features, is formed by a damascene process including dielectric material deposition, etching to form trenches, metal deposition to fill in the trenches and CMP to remove the excessive metal. In another embodiment, each metal layer is formed by metal deposition, metal patterning and dielectric deposition. The method 70 includes an operation 86 to form a bottom via feature 56. In one embodiment, the bottom via feature 56 is formed by a damascene process.

The method 70 includes an operation 88 to form a RRAM device 20. The formation of the RRAM device 20 includes deposition and patterning to form bottom electrode 42, resistive material layer 40 and top electrode 44. The method 70 includes an operation 90 to form a top via feature 56. In one embodiment, the top via feature 56 is formed by another damascene process.

The method 70 includes an operation 92 to form a metal line on the top via feature 56. In the present example, the metal line is in the fifth metal layer. The formation of the metal line in the fifth metal layer is similar to the formation of the metal lines in the other metal layers. For example, the metal line on the top via feature 56 is formed by a damascene process. In another embodiment, the metal line is formed by metal deposition and patterning.

Figure 8:
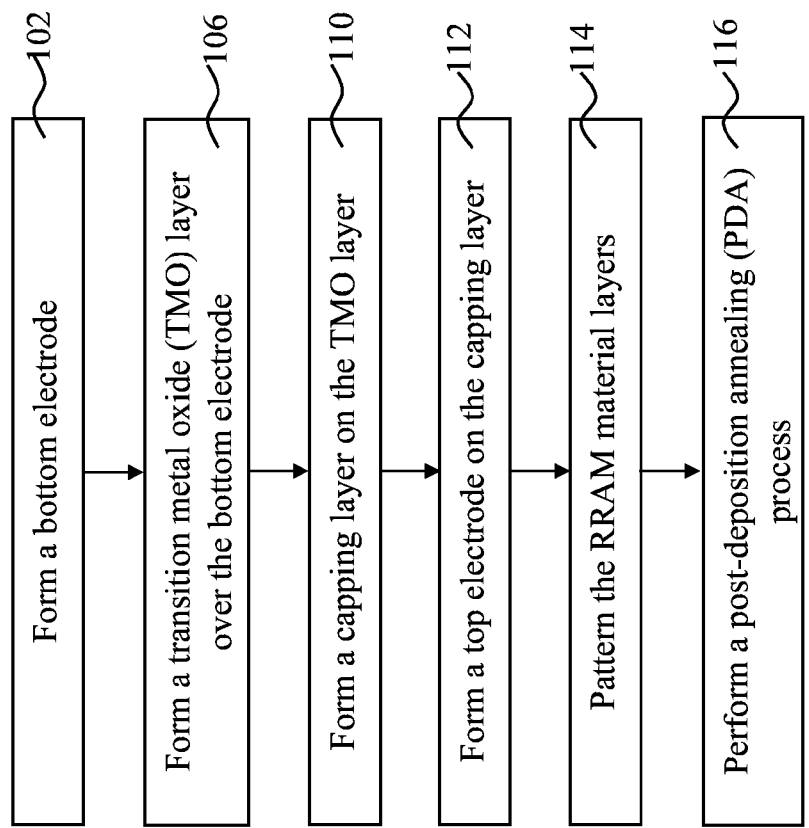
FIG. 8 is a flowchart of a method making of the RRAM device of FIG. 6 constructed according to aspects of the present disclosure in one or more embodiments.
Figure 9:
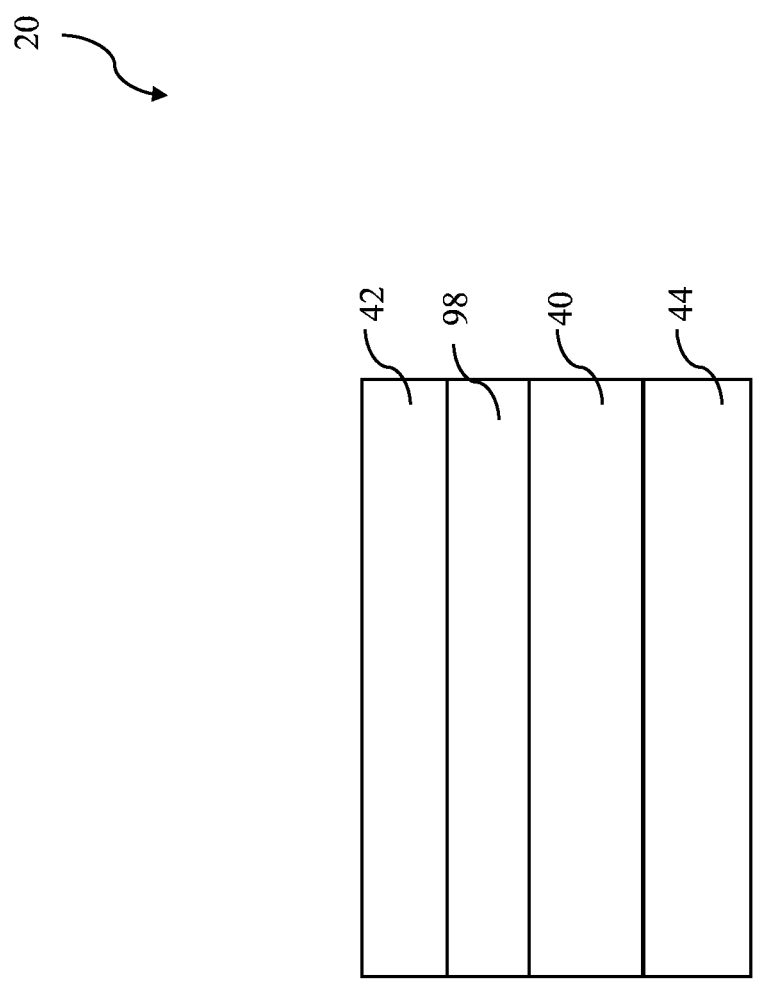
FIG. 9 is a sectional view illustrating an embodiment of the RRAM device of FIG. 4 constructed according to aspects of the present disclosure in one embodiment.

FIG. 8 is one embodiment of a flowchart of the operation (or method) 88 to form the RRAM device 20 and FIG. 9 is a sectional view of the RRAM device 20 constructed according to aspects of the present disclosure in various embodiments. With reference to FIGS. 8 and 9, the method 86 and the RRAM device 20 are collectively described.

The method 88 includes a step 102 to form the bottom electrode (or first electrode) 44 of a conductive material. In one embodiment, the bottom electrode 44 includes titanium nitride (TiN). In another embodiment, the bottom electrode 44 includes tantalum nitride (TaN) or platinum (Pt). In other embodiments, the bottom electrode 44 may include other appropriate conductive materials for forming such an electrode, such as metal, metal nitride, doped polycrystalline silicon (doped poly silicon) or combinations thereof.

In one embodiment, the bottom electrode 44 includes a conductive material having a proper work function such that a high work function wall is built between the bottom electrode 44 and the resistive material layer 40. The bottom electrode 44 can be formed by atomic layer deposition (ALD), physical vapor deposition (PVD or sputtering), or alternatively other suitable processes.

In one example, the bottom electrode 44 includes TiN and is formed by an ALD process using a precursor including TiCl4 and NH3. In furtherance of the example, The ALD process has a deposition temperature ranging between about 200 C and about 500 C. In yet another embodiment, the bottom electrode 44 has a thickness ranging between about 100 angstrom and about 2000 angstrom.

In one embodiment, the method 88 may further include performing a DET process to the bottom electrode 44. The DET process is designed to generate defects in an interface between the bottom electrode 44 and the resistive material layer 40. In one example, the DET process applies a gas to the RRAM device 20 at a raised temperature. In furtherance of the example, the DET process includes applying ammonia gas (NH3) to the bottom electrode 44. The ammonia gas is heated directly or indirectly to a temperature ranging between about 200 C and about 500 C.

In another example, the DET process may include applying a gas, such as NH3, N2, O2, O3, H2O, Cl2, Ar, CF4, H2, N2O, SiH4, CF4, or a combination thereof. During the DET process, the applied gas is directly heated to a high temperature or alternatively, is indirectly heated to the high temperature, such as by heating the RRAM device 20.

The method 88 includes a step 106 by forming the resistive material layer (or sometime referred to as a dielectric material layer) 40 on the bottom electrode 44. The resistive material layer 40 has a characteristic mechanism that its resistivity can be switched between a high resistance state and a low resistance state (or conductive), by applying an electrical voltage. In various embodiments, the resistive material layer 40 includes metal oxide, metal oxynitride or combinations thereof. In the present embodiment, the resistive material layer 40 includes a transition metal oxide (TMO). In one example, the resistive material layer 40 includes zirconium oxide. In other examples, the resistive material layer 40 includes tantalum oxide or hafnium oxide.

The resistive material layer 40 may be formed by a suitable technique, such as ALD with a precursor containing zirconium and oxygen. In another example, the resistive material layer 40 may be formed by PVD, such as a PVD process with a zirconium target and with a gas supply of oxygen to the PVD chamber. The resistive material layer 40 has a proper thickness for improved memory device performance including retaining time, reliable data storage, and writing easiness. In one example, the resistive material layer 40 includes a thickness ranging between about 20 angstrom and about 200 angstrom.

In one embodiment, the method 88 may include performing a DET process to the resistive material layer 40. The DET process at this step is designed to generate defects on the resistive material layer 40. In one example, the DET process applies a gas to the RRAM device 20 at a raised temperature. In furtherance of the example, the DET process includes applying ammonia gas (NH3) to the resistive material layer 40. In one example, the ammonia gas is heated directly or indirectly to a temperature ranging between about 200 C and about 500 C.

In another example, the DET process includes applying a gas, such as NH3, N2, O2, O3, H2O, Cl2, Ar, CF4, H2, N2O, SiH4, CF4, or a combination thereof. During the DET process, the applied gas is directly heated to a high temperature or alternatively, is indirectly heated to a high temperature.

In other alternative embodiments, the method 88 may include one of the first DET process applied to the bottom electrode 44 and the second DET process applied to the resistive material layer 40. In yet another embodiment, the DET process may be applied during the deposition of the resistive material layer. In yet another embodiment, the formation of the resistive material layer 40 and the DET process are simultaneously implemented. For example, the resistive material layer 40 is formed by PVD using a zirconium target and an oxygen-containing gas. The gas supplied to the PVD chamber may further include a gas for DET, such as ammonia. In another example, the gas supplied to the PVD chamber may further include NH3, N2, O2, O3, H2O, Cl2, Ar, CF4, H2, N2O, SiH4, CF4, or a combination thereof. In yet another example, the gas for the DET is heated before introducing to the RRAM device 20 or during the deposition of the resistive material layer 40.

The method 88 may include a step 110 to form a capping layer 98 on the resistive material layer 40. The capping layer 98 includes a conductive material that is unstable and is capable of depriving oxygen from adjacent material. In the present embodiment, the capping layer 108 includes titanium (Ti) and may be formed by PVD or other suitable technique. In another embodiment, the capping layer 98 has a thickness ranging between about 20 angstrom and about 200 angstrom.

In other embodiments, the capping layer 98 includes Ti, tantalum (Ta) or hafnium (Hf). In another embodiment, the capping layer 98 includes metal oxide. In yet other embodiments, the capping layer 98 and the resistive material layer 40 are chosen to have a pair of a conductive material and a resistive material, such as titanium (Ti) and zirconium oxide; or tantalum and tantalum oxide; titanium and hafnium oxide; or hafnium and hafnium oxide. However, the capping layer 98 may be eliminated in other embodiment.

The method 88 includes a step 112 by forming the top electrode (or second electrode) 42 on the capping layer 98 or on the resistive material layer 40 (if the capping layer 98 is not present). In one embodiment, the top electrode 42 includes tantalum nitride (TaN). The top electrode 42 may be formed by PVD or other suitable technique. In another embodiment, the top electrode 42 has a thickness ranging between about 100 angstrom and about 2000 angstrom. Alternatively, the top electrode 42 includes other suitable conductive material to electrically connect the device to other portion of an interconnect structure for electrical routing. In other embodiments, the top electrode 42 includes metal, metal-nitride, doped polysilicon or other suitable conductive material.

The method 88 includes a step 114 to pattern the various material layers to form one or more RRAM device. Particularly, the bottom electrode 44 and the top electrode 42 are defined by patterning. In one embodiment, the various RRAM material layers (such as the resistive material layer 40, the capping 98 and the two electrodes) are patterned by a procedure that includes lithography process and etch. For example, a hard mask is deposited on the top electrode 42 and is patterned by a lithography process and an etch process; and then the various RRAM material layers are etched through the openings of the hard mask. The hard mask is used as an etch mask and may include a suitable resistive material, such as silicon oxide, silicon nitride, other resistive material or a combination thereof. In another embodiment, a patterned resist layer is used as an etch mask.

In one embodiment, the RRAM material layers may be patterned by more than one patterning procedures. For example, the bottom electrode 44 is patterned by a first patterning procedure. The resistive material layer 40 and the top electrode 42 are patterned by a second patterning procedure.

In another embodiment, the top electrode and the bottom electrode are patterned in a different sequence. During the first patterning procedure to pattern the top electrode 110, a hard mask is deposited on the top electrode 42 and is patterned by a lithography process and an etch process; and then the top electrode 42 is etched through the openings of the hard mask. Alternatively, a patterned resist layer is used as an etch mask. Then the bottom electrode 44 is patterned. In one example, the bottom electrode 44 is patterned by a procedure similar to the procedure to pattern the top electrode 42. In yet another embodiment, the RRAM device 20 may be formed by a procedure similar to a damascene process including etching and deposition.

The method 88 may further include a step 116 to perform a post-deposition annealing (PDA) process to the RRAM device 20. The PDA process is designed to further generate oxygen vacancies in the resistive material layer 40. In one embodiment, the PDA process has an annealing temperature ranging between about 300 C and about 500 C.

FIG. 10 is a diagram illustrating a current vs. voltage curve (I-V curve) 130 of the RRAM device 20 during a bidirectional forming process constructed according to aspects of the present disclosure in one embodiment. The horizontal axis represents a voltage applied to RRAM device 20 (or a bias voltage applied to the bottom electrode as shown in FIG. 4 according to one example). The corresponding unit is volt (or V). The vertical axis represents a current through the RRAM device 20. The corresponding unit is ampere (or A).

A "forming" process (or operation) is described below. The forming process is designed to change the structure of the resistive material layer 40 of the RRAM device 20 such that a conductive path is generated therein. In the present embodiment, filament features are generated in the resistive material layer 40 of the RRAM device 20.

In the forming process, a forming voltage is applied to the two electrodes of the RRAM device 20. For example, the bottom electrode is connected to a low voltage $V_{low}$ and the top electrode is connected to a high voltage $V_{high}$. The difference of $V_{high}-V_{low}$ provides the forming voltage. In the "forming" operation, the "forming" voltage is high enough to generate conductive features in the resistive material layer 40. In one example, the conductive features include a plurality of conductive filament to provide a conductive path such that the resistive material layer 40 is "on" or in low resistance state. The conductive path may be related to the lineup of the oxygen vacancies in the resistive material layer 40.

The I-V curve 130 illustrates a two-step forming process. The forming process includes two steps: a first forming step applies a first (forming) voltage Vf1 to the RRAM device 20 and a second forming step applies a second (forming) voltage Vf2 to the RRAM device 20, wherein the second voltage is different from the first voltage. Particularly, in the first forming step, the first voltage is applied to the RRAM device 20 in a first direction (or first polarity). In the second forming step, the second voltage is applied to the RRAM device 20 in a second direction (or second polarity) that is opposite to the first direction. Therefore, the forming process is also referred to as bidirectional forming process. The first forming step is also referred to a forward forming step and the second forming step is referred to as a reverse forming step. In one embodiment, the first voltage Vf1 is greater than the second voltage Vf2 in magnitude.

The first forming step effectively reduces the sizes of the conductive filaments (CF) generated in the resistive material layer 40. The second forming step creates vacancy on the top side of the resistive material layer 40.

The bidirectional forming process is further explained with reference to FIGS. 4 and 10. The first forming step 132 applies the first voltage to the RRAM device 20. In the first forming process, the first voltage Vf1 is a positive voltage in a first region 132. Specifically, the first voltage Vf1 is applied between the two electrodes of the RRAM device 20 such that the bottom electrode has a higher voltage relative to that of the top electrode. In one embodiment, the first voltage Vf1 ranges between about 2.8 V and about 3.5 V.

In the second forming process, the second voltage Vf2 is a negative voltage in a second region 134. Specifically, the second voltage Vf2 is applied between the two electrodes of the RRAM device 20 such that the bottom electrode has a lower voltage relative to that of the top electrode. In one embodiment, the second voltage Vf2 ranges between about −1.4 V and about −1.6 V.

The RRAM cell 12 is a three terminal device wherein a gate voltage Vg is applied to the gate "G" of the FET 24 (as illustrated in FIG. 4) during the forming process. The gate voltage Vg is applied to the FET 24 such that the FET 24 is turned on. The Vg may be further tuned to generate a proper current Id through the RRAM device 20 such that one of the multiple resistive levels may be chosen according to the current Id. In one embodiment of the forming process, the gate voltage Vg is applied the gate "G" during both the first and second forming steps. In furtherance of the embodiment, the gate voltage ranges between about 0.8 V and about 1.1 V while the first voltage Vf1 ranges between about 2.8 V and about 3.5 V and the second voltage Vf2 ranges between about −1.4 V and about −1.6 V.

FIG. 11 is a diagram illustrating a current vs. voltage curve (I-V curve) 140 of the RRAM device 20 according to one embodiment. The horizontal axis represents a voltage applied to RRAM device 20 (or a bias voltage applied to the bottom electrode in one example). The corresponding unit is volt (or V). The vertical axis represents a current through the RRAM device 20. The corresponding unit is ampere (or A). The I-V curve 140 is constructed according to experimental data from one sample of the RRAM device 20.

The I-V curve 140 includes a set voltage range 142 that is positive or in one polarity and a reset voltage range 144 that is negative or in the opposite polarity. The operation "set" applies a set voltage in the set voltage range 142 with a first polarity and the operation "reset" applies a reset voltage in the reset voltage range 144 with a second polarity opposite from the polarity. Therefore, the operations of the RRAM device 20 are in a bipolar mode.

The I-V curve 140 includes a high resistance (HR) state 146 and a low resistance (LR) state 148. Therefore, the resistive material layer 40 is able to function as data storage. The LR state 146 and HR state 148 represent "on" (or "1") and "off" (or "0"), respectively, or vise versa. The LR state and HR state have a resistance ratio 149 of about 70 or greater. The high resistance ratio and the stable switching are achieved with the resistive material layer 40 treated by the bidirectional forming process. This is attributed to high oxygen vacancy density and small sizes of the conductive filament features (that will be further explained later).

In one embodiment, the I-V curve 140 additionally includes one or more different resistive state that has a resistance lower than that of the resistance of the HR state 146 and higher than that of the resistance of the LR state 148. The various resistance states are achievable by controlling the current Id flowing through the RRAM device 20 during the "set" operations.

In one embodiment, the set voltage Vset ranges between about 0.7 V and about 1.1 V. In another embodiment, the reset voltage Vset ranges between about 0.6 V and about 0.9 V. The gate voltage Vg is applied during the set and reset operation. In another embodiment, the gate voltage Vg ranges between about 0.8 V and about 1.1 V during the set operation while the set voltage Vset ranges between about 0.7 V and about 1.1 V. In yet another embodiment, the gate voltage Vg ranges between about 0.9 V and about 1.2 V during the reset operation while the reset voltage Vreset ranges between about 0.6 V and about 0.9 V.

Figure 12:
FIG. 12 is a table illustrating various operations of the memory device of FIG. 4 constructed according to aspects of the present disclosure in one embodiment.

FIG. 12 is a table 150 that provides various operations constructed according to aspects of the present disclosure in one or more embodiment. As noted above, the RRAM cell 12 is a three terminal device that includes the gate 34 of the FET 24, the top electrode 42 of the RRAM device 20 and the source 35 of the FET 24 as the three terminals, respectively, as illustrated in FIG. 4. The voltages applied to the gate 34 of the FET 24, the top electrode 42 of the RRAM device 20 and the source 35 of the FET 24 are referred to as Vg, Vp and Vs, respectively. Additionally, the substrate 30 may be floating or biased by a body voltage Vb for improved performance of the RRAM cell 12. In the present embodiment, the Vb is 0 or grounded during various operations. The operations listed in the table 150 include the first forming step (labeled as "1$^{st}$ Forming"), the second forming step ("2$^{nd}$ Forming"), reset ("Reset") and set ("Set"). In the present embodiment, Vs is grounded or Vs=0 for various operations and the gate is positively biased or Vg>0. According to the table 150, Vp is positive or >0 in the first forming step. Vp is negative or <0 for the second forming step. Vp is positive or >0 in the set operation. Vp is negative or <0 in the reset operation.

Figure 13:
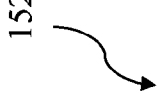
FIG. 13 is a table illustrating various operations of the memory device of FIG. 4 constructed according to aspects of the present disclosure in another embodiment.

Alternatively, those operations may be applied in a different mode such that all voltages are positive to achieve the similar effects, as illustrated in a table 152 of FIG. 13. The table 152 provides various operations constructed according to aspects of the present disclosure in other embodiments. In the present embodiment, the substrate 30 is grounded or Vb=0 during various operations. According to the table 152, the gate is positively biased or Vg>0 during various operations. In the first forming step, the source is grounded or Vs=0 while the top electrode is positively biased or Vp>0. In the second forming step, the top electrode is grounded or Vp=0 while the source is positively biased or V>0. Thus, the second voltage on the RRAM device 20 is still negative and opposite to the first voltage since the voltage of the top electrode is lower than that of the source. However, negative voltage is avoided in those terminals. The corresponding drive circuit may be designed more simple and be cost-effective. Similarly, in the set operation, the source is grounded or Vs=0 while the top electrode is positively biased or Vp>0. In the reset operation, the top electrode is grounded or Vp=0 while the source is positively biased or V>0.

In one embodiment, the voltages (or signals) applied to the terminals during various operations (such as forming, set and reset) are direct current (DC) signals. In another word, the voltages are constant voltages. In an alternative embodiment, the voltages applied to the terminals during various operations are alternating current (AC) signals, or pulsed signals. In another word, the voltages change over time. However, the polarity of each voltage is kept unchanged. Specifically, when the voltage applied to one terminal is positive according to the table 150 or 152, the corresponding AC voltage is always positive. This can be achieved by using a combination of an AC signal and a DC signal. For example, Vtotal=Vac+Vdc wherein Vac is a pure AC component of the total voltage and Vdc is the DC component. When Vdc is positive and the magnitude of Vdc is greater than the magnitude of the Vac, the total voltage is kept positive.

Figure 14:
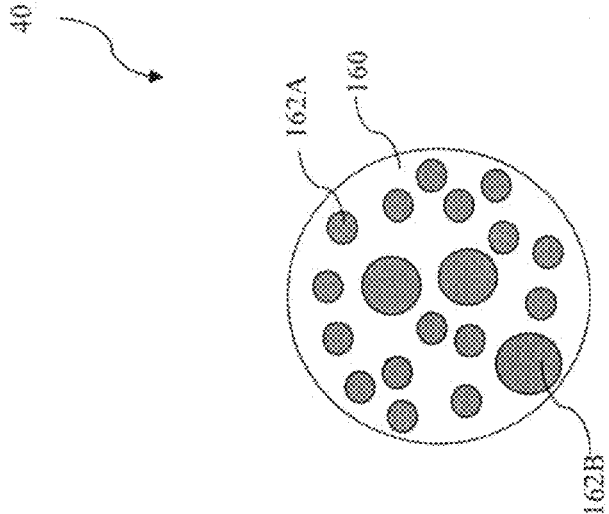
FIG. 14 is a top view of a resistive material layer in the memory device of FIG. 4 constructed according to aspects of the present disclosure in one embodiment.

The bidirectional "forming" process and the formation of the conductive filaments thereby are further described with reference to FIG. 14 as a top view of the resistive material layer 40. FIG. 14 only shows exemplary filament features for illustration. After the bidirectional forming process, the resistive material layer 40 includes a dielectric region 160 and a plurality of filament features 162. The filament features 162 are distributed in the resistive material layer 40 and surrounded by the dielectric region 160. The filament features 162 includes two subsets categorized according to its size (or radius) relative a median. The filament features 162 has a size distribution, its median M is defined as the numerical value separating the higher half of the filaments from a lower half. Accordingly, the filaments 162 includes a first subset features 162A each having a size less than the median (r<M) and a second subset features 162B each having a size greater than the median (r>M). The total area of the first subset features 162A is referred to as $A_s$. The total area of the second subset features 162B is referred to as $A_l$. A filament ratio is defined as $A_s/(A_s+A_l)$. In the present embodiment, by applying the bidirectional forming process, the resistive material layer 40 has the filament ratio no less than 0.5 or >=0.5 or greater than about 0.5.

In another particular embodiment, the first subset features are defined as the filament features each with a size smaller than about 5 nm and the second subset features are defined as the filament features each with a size greater than about 5 nm. By applying the bidirectional forming process, the resistive material layer 40 has the filament ratio greater than about 0.5.

Instead of one forming step, by applying the bidirectional forming process, the resistive material layer 40 and the corresponding RRAM device 20 has the filament ratio greater than about 0.5. In contrast, the resistive material layer treated by one step forming process has a filament ratio less than about 0.5. The RRAM device 20 treated by the bidirectional forming process has a greater filament ratio. That means that filament sizes are relatively smaller or the average size of the filament features 162 is smaller. It is easier to reset for disconnecting the conductive or easier to set for connecting the conductive path. Accordingly, various voltages applied to the RRAM device 20 during set and reset operations can be small. The reliability and performance of RRAM cell 12 are improved. This is further explained with reference to FIG. 15 and FIG. 4.

Figure 15:
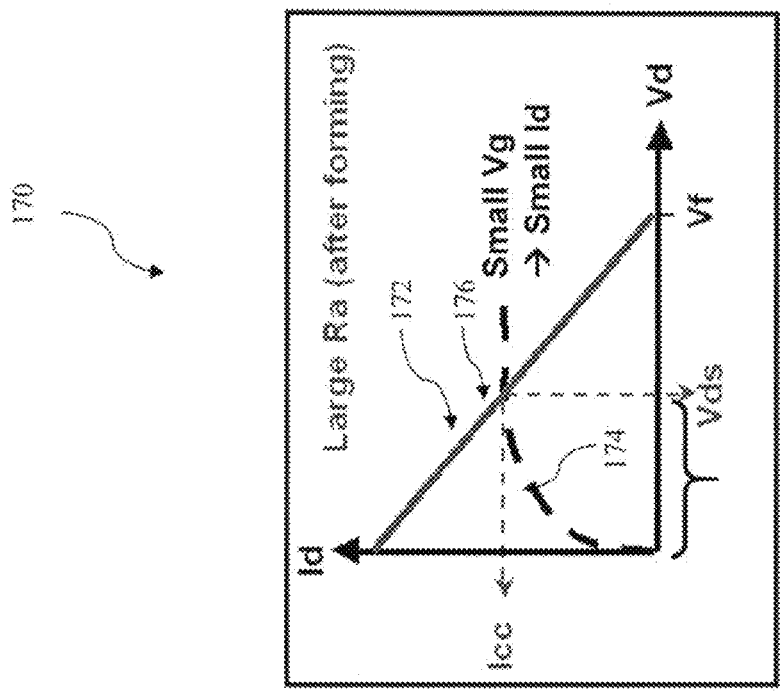
FIG. 15 is a diagram illustrating a current vs. voltage behavior of the RRAM cell of FIG. 4 during various operations in one embodiment.

FIG. 15 is a diagram 170 illustrating various current vs. voltage curves of the RRAM device 20 during various operations constructed according to aspects of the present disclosure in one embodiment. The horizontal axis represents a voltage Vd applied to RRAM device 20 (or a bias voltage applied to the bottom electrode as shown in FIG. 4 according to one example). The vertical axis represents a current Id through the RRAM device 20.

In FIG. 15, the line 172 represents a V-I line of the RRAM device 20 and the curve 174 represents a V-I curve of the FET 24. An intersected point 176 is defined between the V-I line 172 and the V-I curve 174. The corresponding current Icc and voltage Vds (voltage between the source and drain of the FET 24) are labeled in FIG. 17. Since average size of the filament features 162 is small, the resistance Ra of the RRAM device 20 is large. Thus, the slop of the V-I line 172 is small and Vds is small. That means that the voltage applied to the FET 24 during operations is small. Accordingly, the damage to the FET 24 is eliminated or reduced.

In various embodiments, other advantages may present. For example, since operation voltage and current are reduced in the RRAM cell 12, it is expected to fabricate a RRAM array with high density and good switching stability.

The present disclosure provides a resistive random access memory (RRAM) structure. The RRAM structure includes a bottom electrode on a substrate; a resistive material layer on the bottom electrode, the resistive material layer having filament features with a filament ratio greater than about 0.5; and a top electrode on the resistive material layer.

The present disclosure also provides another embodiment of an integrated memory device. Integrated memory device includes a field-effect transistor (FET) formed on a substrate; and a resistive random access memory (RRAM) structure formed on the substrate and electrically coupled with the FET. The RRAM structure further includes a bottom electrode, a transition metal oxide layer on the bottom electrode, and a top electrode on the transition metal oxide layer. The transition metal oxide layer includes filament features with a filament ratio greater than about 0.5.

The present disclosure also provides one embodiment of a method for operating a resistive random access memory (RRAM) cell having a RRAM structure that includes a bottom electrode, a top electrode and a resistive material layer interposed between the bottom and top electrode. The method includes performing a bidirectional forming process that includes performing a first forming operation by applying a first voltage to the RRAM structure in a first polarity; and performing a second forming operation by applying a second voltage to the RRAM structure in a second polarity that is opposite to the first polarity.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus comprising:
a memory device that includes a resistive material layer having filament features with a filament ratio that is equal to or greater than about 0.5, wherein the filament features has a size distribution with a characteristic size $S_m$, wherein the filament features includes a first subset features each with a radius less than $S_m$ and a second subset features each with a radius greater than $S_m$, and wherein the filament ratio is defined as $A_s/(A_s+A_l)$, wherein $A_s$ is a first sum of sectional areas of the first subset features and $A_l$ is a second sum of sectional areas of the second subset features.

2. The apparatus of claim 1, wherein the memory device further includes:
a first conductive layer disposed over a substrate;
a second conductive layer disposed over the first conductive layer, and
wherein the resistive material layer is disposed between the first and second conductive layers.

3. The apparatus of claim 2, wherein the memory device further includes a capping layer disposed between the first and second conductive layers.

4. The apparatus of claim 3, wherein the capping layer physically contacts the resistive material layer, and wherein the capping layer physically contacts one of the first and second conductive layers.

5. The apparatus of claim 1, wherein the resistive material includes a material selected from the group consisting of a metal oxide and a metal oxynitride.

6. The apparatus of claim 1, wherein the resistive material includes a transition metal oxide selected from the group consisting of zirconium oxide, tantalum oxide, and hafnium oxide.

7. The apparatus of claim 1, further comprising a current controlling device coupled to the memory device, wherein current controlling device includes a transistor.

8. An apparatus comprising:
an interconnect structure that includes:
a first metal layer having a first metal feature;
a second metal layer having a second metal feature that is disposed over the first metal layer;
a first via feature overlying the first metal feature and electrically coupled with the first metal feature; and
a second via feature underlying the second metal feature and electrically coupled with the second metal feature; and
a memory device that includes a resistive material layer having filament features with a filament ratio that is equal to or greater than about 0.5, wherein the memory device is overlying and electrically coupled with the first via feature and wherein the memory device is underlying and electrically coupled with the second via feature.

9. The apparatus of claim 8, further comprising a transistor having a gate disposed over a substrate and electrically coupled to the memory device, wherein the substrate includes a source/drain region associated with the transistor.

10. The apparatus of claim 9, further comprising:
a word line electrically coupled to the gate of the transistor;
a source line electrically coupled to the source/drain region; and
a bit line electrically coupled to the memory device.

11. The apparatus of claim 10, wherein source line is directly connected to the source/drain region.

12. The apparatus of claim 8, wherein the interconnect structure further includes:
a third metal layer having a third metal feature;
a fourth metal layer having a fourth metal feature that is disposed over the third metal layer;
a fifth metal layer having a fifth metal feature that is disposed over the fourth metal layer;
a third via feature overlying the third metal feature and electrically coupled with the third metal feature and the fourth metal feature;

a fourth via feature overlying the fourth metal feature and electrically coupled with the fourth metal feature and the fifth metal feature; and a fifth via feature overlying the fifth metal feature and electrically coupled with the fifth metal feature and the first metal feature.

13. The apparatus of claim 12, wherein the fifth metal layer underlies the first and second metal layers.

14. The apparatus of claim 8, wherein the memory device is a resistive random access memory device that includes:
a first conductive layer disposed over a substrate;
a second conductive layer disposed over the first conductive layer, and
wherein the resistive material layer is disposed between the first and second conductive layers.

15. The apparatus of claim 14, wherein the first conductive layer is formed of a different material than the second conductive layer.

16. A method comprising:
performing a first forming operation on a memory device by applying a first voltage having a first polarity;
performing a second forming operation on the memory device by applying a second voltage having a second polarity that is opposite to the first polarity;
setting the memory device by applying a third voltage having the first polarity to the memory device, wherein the third voltage is different than the first voltage and different than the second voltage; and
resetting the memory device by applying a fourth voltage having the second polarity to the memory device, wherein the fourth voltage is different than the first voltage and different than the second voltage, and
wherein the memory device include a resistive material layer,
wherein after performing the first and second forming operations the resistive material layer has filament features with a filament ratio that is equal to or greater than about 0.5, and
wherein the filament features has a size distribution with a characteristic size $S_m$, wherein the filament features includes a first subset features each with a radius less than $S_m$ and as subset features each with a radius greater than $S_m$, and wherein the filament ratio is defined as $A_s/(A_s+A_l)$, wherein $A_s$ is a first sum of sectional areas of the first subset features and $A_l$ is a second sum of sectional areas of the second subset features.

17. The method of claim 16, wherein the third voltage is less than the first voltage and less than the second voltage, and wherein the fourth voltage is less than the first voltage and less than the second voltage.

18. The method of claim 16, wherein the resistive material layer includes having $ZrO_2$ and $ZrO_x$ with a ratio of $ZrO_x/ZrO_2$ being greater than 1, and wherein x is a number less than 2.

19. The method of claim 16, wherein the second voltage is less than the first voltage in magnitude.

20. The method of claim 16, wherein the resistive material layer includes a metal oxide and a metal oxynitride.

* * * * *